US012707583B2

(12) United States Patent
Lench et al.

(10) Patent No.: US 12,707,583 B2
(45) Date of Patent: Aug. 11, 2026

(54) LOCKING MECHANISM FOR LIQUID COOLED PLUGGABLE MODULES

(71) Applicant: HEWLETT PACKARD ENTERPRISE DEVELOPMENT LP, Spring, TX (US)

(72) Inventors: Kasey Renee Lench, Houston, TX (US); David Arthur Selvidge, Cypress, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 265 days.

(21) Appl. No.: 18/489,154

(22) Filed: Oct. 18, 2023

(65) Prior Publication Data

US 2025/0133676 A1 Apr. 24, 2025

(51) Int. Cl.
*H05K 7/20* (2006.01)
*H05K 7/14* (2006.01)

(52) U.S. Cl.
CPC ....... *H05K 7/1401* (2013.01); *H05K 7/20254* (2013.01); *H05K 7/20781* (2013.01)

(58) Field of Classification Search
CPC ............. H05K 7/1401; H05K 7/20254; H05K 7/20781; H05K 7/1408; H05K 7/1487; H05K 7/20772; G06F 1/186; G06F 1/187; G06F 2200/201; G06F 1/20
See application file for complete search history.

(56) References Cited

U.S. PATENT DOCUMENTS

| | | | |
|---|---|---|---|
| 10,874,032 B2 * | 12/2020 | Leigh | H05K 7/20636 |
| 2020/0260615 A1 | 8/2020 | Leigh et al. | |
| 2022/0173015 A1 | 6/2022 | Subrahmanyam et al. | |

FOREIGN PATENT DOCUMENTS

| | | |
|---|---|---|
| CN | 116027861 A | 4/2023 |

OTHER PUBLICATIONS

Intel Corporation, “Intel Server D50TNP Family,” Integration & Service Guide, Rev. 1.4, Mar. 2022, 235 pages.

* cited by examiner

*Primary Examiner* — Imani N Hayman
*Assistant Examiner* — Hung Q Dang
(74) *Attorney, Agent, or Firm* — Jones Burke, PLLC

(57) ABSTRACT

An information processing device comprises bays to removably receive pluggable modules, a liquid cooling system comprising cold plates in the bays, and a module locking mechanism. The cold plates are movable between an engaged state with the pluggable modules and a disengaged state. The module locking mechanism prevents insertion and removal of the pluggable modules into or out of the bays if the cold plates are in the engaged state, and allows insertion/removal of the pluggable modules if the cold plates are in the disengaged state. The device may also comprise a cold plate engagement mechanism actuatable to move the cold plates between the engaged and disengaged states, and the module locking mechanism may be mechanically coupled to the cold plate engagement mechanism such that actuation of the cold plate engagement mechanism drives the module locking mechanism to switch between preventing and allowing insertion/removal.

17 Claims, 14 Drawing Sheets

110
120
130
131-1
131-2
131-3
140
161
162-1
162-2
162-3
163
164
165
166
180
189
132
121
z
y
x 110
120
130
131-1
131-2
131-3
121
132
140
195
143
194
142
180
188
162-1
162-2
162-3
192
189
191
193
z
y
x 110
120
130
131-1
131-2
131-3
121
132
140
142
143
161
162-1
162-2
162-3
163
164
165
166
180
x
y
z 110
120
121
130
131-1
131-2
131-3
132
140
142
143
162-1
162-2
162-3
163
164
165
166
180
x
y
z 161
162-1
169
164
168
173
171
172
170
162-2
166
163
164
162-3
167
z
x
y 132
162
121
170
175
183
182
181
122
180
124
123
z
x
y 180
170
182
173
183
175
172
132
121
123
z
x
y 124
155
153
125
152
154
175
180
182
183
192
188
z
y
x 159
157
185
156
158
186
151
158
150
z
y
x

LOCKING MECHANISM FOR LIQUID COOLED PLUGGABLE MODULES

INTRODUCTION

Some information processing devices, such as computers, networking devices, etc., have bays arranged to removably receive pluggable modules, such as pluggable media drives or other pluggable auxiliary devices. The bays may each comprise a receptacle to receive the pluggable module and one or more connectors disposed in the receptacle to mate with complementary connector(s) of the pluggable module to establish an electronic, optical, or other connection through which signals can be communicated.

Pluggable modules may be differentiated from other components of the information processing device (such as a primary system board, CPU, etc.) in that the pluggable modules are designed for easy and repeated installation and removal, whereas the other components of the information processing device may be more permanently installed. For example, the pluggable module bays may be arranged to be accessible from an exterior of the chassis, and the installation/removal of the pluggable modules generally does not require the use of tools or the disassembly or powering-off of the information processing device (e.g., the pluggable modules may be a hot-pluggable). In contrast, while it is technically possible to remove and install other components of the information processing device (e.g., CPU, memory, etc.) if needed (such as for an upgrade or repair), usually this is more difficult, often requiring the partial disassembly of the device (e.g., opening the chassis) and the powering-off of the information processing device.

A common example of a pluggable module is a pluggable media drive, such as a pluggable solid-state drive (SSD) (which may include, for example, NVMe or M.2 SSDs) and a pluggable hard disk drive (HDD). Other examples of pluggable modules include pluggable optical transceivers, pluggable PCIe cards, and other similar pluggable auxiliary devices.

Pluggable modules generate heat while in use, and thus information processing devices with pluggable modules are generally configured to remove heat from the pluggable modules in some way. For example, in an air-cooled information processing device, some of the air flowing though the device may pass through the pluggable modules to cool them. In other information processing devices, liquid cooling may be utilized to cool the pluggable modules (and other components of the information processing device). To liquid cool a pluggable module, a cold plate may be thermally coupled with the pluggable module, and the cold plate may transfer heat from the pluggable module into a flow of liquid coolant.

BRIEF DESCRIPTION OF THE DRAWINGS

The present disclosure can be understood from the following detailed description, either alone or together with the accompanying drawings. The drawings are included to provide a further understanding of the present disclosure and are incorporated in and constitute a part of this specification. The drawings illustrate one or more examples of the present teachings and together with the description explain certain principles and operations. In the drawings.

DETAILED DESCRIPTION

Figure 1:
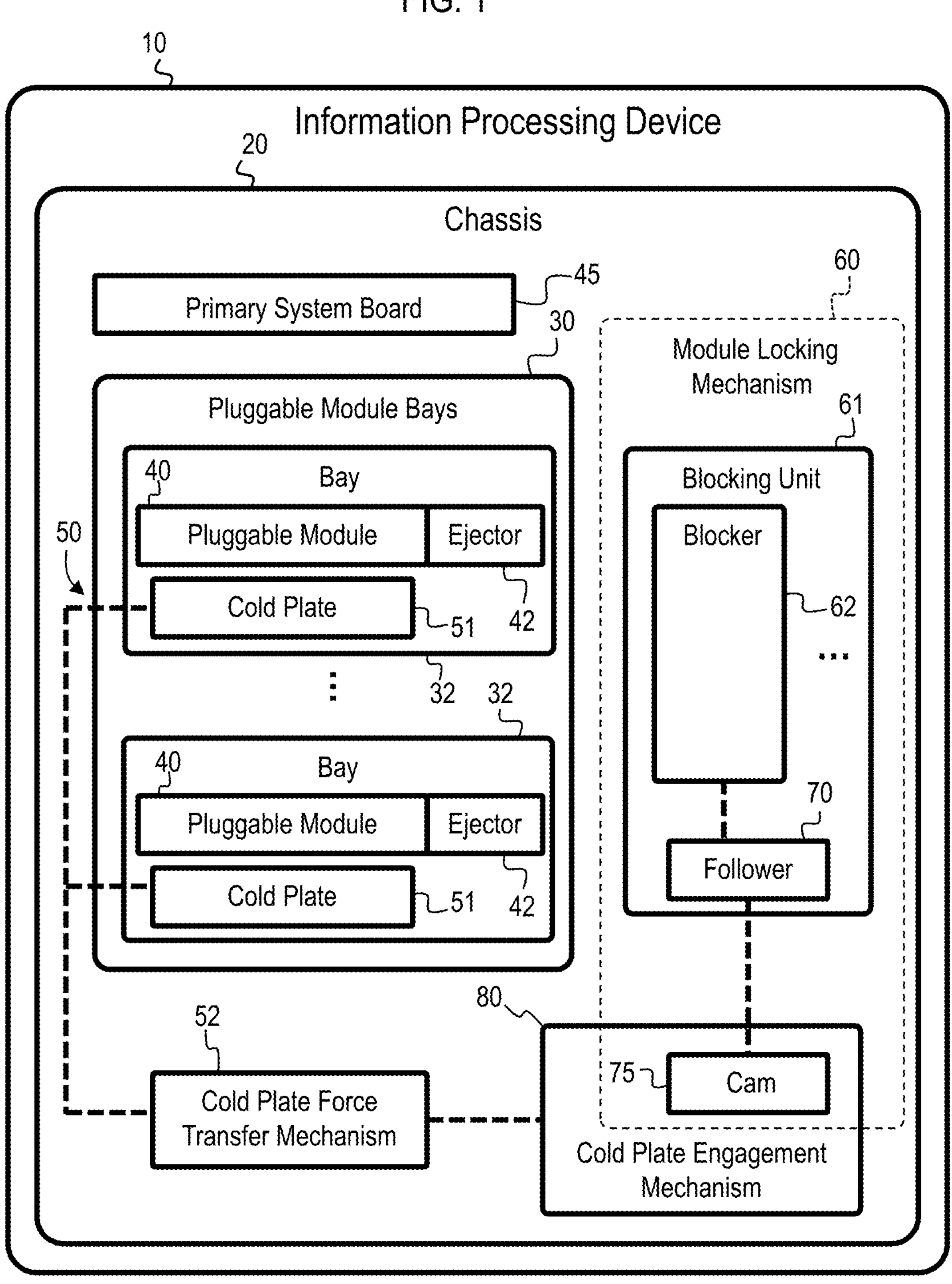
FIG. 1 is a block diagram schematically illustrating an example information processing device with a pluggable module locking mechanism.

Good thermal contact, with sufficient contact pressure, is usually needed between the cold plate and the pluggable module in order to achieve desired thermal conductivity. However, because the pluggable modules are designed to be easily and repeatedly installed and removed, achieving this good thermal contact may be challenging. For example, it might not be possible to fixedly attach the cold plates to the pluggable modules in the same way that you might for a CPU or other component, because this would impair the ability to easily install or remove the pluggable module. Thus, to provide good thermal contact between cold plates and pluggable modules while still allowing for easy insertion/removal of the module, some information processing devices arrange the cold plates to be movable between engaged and disengaged positions. In the engaged position, the cold plates are in contact with the pluggable modules (directly or via a thermal interface material (TIM)) with sufficient contact pressure to provide desired thermal conductivity. In the disengaged position, the cold plates are moved away from and cease to contact the pluggable modules, and thus the cold plates in this position do not interfere with the easy insertion or removal of the pluggable modules.

However, one issue that is faced in information processing devices that utilize movable cold plates to cool pluggable modules is that a user may forget to disengage the cold plates prior to inserting a new pluggable module or removing an existing pluggable module. If the user attempts to remove a pluggable module while the cold plates are still in the engaged position, sliding contact will occur between the cold plate and the pluggable modules as the pluggable module is removed from the bay, which can result in the cold plate and/or the pluggable module being scratched or otherwise damaged. In addition, if a TIM is disposed between the cold plate and the pluggable module, the TIM may be damaged or rubbed off due to the sliding contact. If the user attempts to install a new pluggable module while the cold plates are still in the engaged position, the cold plate may protrude into the path of the pluggable module and thus the pluggable module may collide with the cold plate, which may cause damage to the cold plate and/or pluggable module. In addition, the sliding contact described above in relation to removing a pluggable module is also likely to occur during the insertion of a pluggable module—for example, the collision of the pluggable module with the cold plate may push the cold plate aside, allowing the insertion of the pluggable module farther into the bay to continue, whereupon the same type of sliding contact described above, and the damage resulting therefrom, may occur.

A technical solution to the above-described problems comprises a pluggable module locking mechanism which is configured to automatically prevent the installation or removal of a pluggable module into or out of a group of bays while the cold plates which service those bays are in the engaged state. In addition, the pluggable module locking mechanism is configured to automatically unlock and allow the installation or removal of pluggable modules if the cold plates are moved to the disengaged state. In other words, the pluggable module locking mechanism is movable between a locked state in which it prevents installation or removal of pluggable modules and an unlocked state in which it allows installation or removal of pluggable modules, and the pluggable module locking mechanism is configured to automatically move between these states in response to engagement or disengagement of the cold plates. Accordingly, a user cannot inadvertently install or remove a pluggable module while the cold plates are engaged, and the damage to cold plate, pluggable module, and/or TIM that might otherwise occur can be prevented.

In some examples, in the locked state, the pluggable module locking mechanism prevents the insertion or removal of a pluggable module into or out from a bay by physically blocking the bay. For example, the pluggable module locking mechanism may comprise one or more blockers which, in the locked state, are positioned over a portion of each of the bays to physically block a pluggable module from being inserted or removed.

In some examples, in addition to physically blocking the bays, in the locked state the blockers may also cover and block access to ejection mechanisms of pluggable modules installed in the bays, thus preventing a user from actuating the ejection mechanisms. For example, in some cases the ejection mechanism may comprise an ejection button disposed on a front face of the pluggable module, which is actuatable to initiate an ejection sequence (e.g., pressing the ejection button may release a connect/disconnect lever of the pluggable module from a stowed state), and the blocker may cover this button and prevent it from being pressed. As another example, in some cases the ejection mechanism may comprise the aforementioned connect/disconnect lever, which is pulled outward to eject the module, and the blocker may cover this lever and thus physically prevent (block) it from being pulled outward.

In some examples, the pluggable module locking mechanism is a mechanical interlock that is mechanically coupled to a cold plate engagement mechanism such that the locked and unlocked state of the pluggable module locking mechanism are mechanically correlated to (i.e., dependent upon) the engaged and disengaged state of the cold plates, respectively. In other words, the mechanical coupling is such that whenever the cold plates are engaged the locking mechanism is locked, and whenever the cold plates are disengaged the locking mechanism is unlocked. More specifically, in some examples, the cold plate engagement/dis-engagement mechanism is actuatable to move the cold plates between the engaged and disengaged positions (in some examples, the cold plate engagement/dis-engagement mechanism is manually actuatable while in other examples it is actuated by a powered actuator), and the pluggable module locking mechanism is mechanically linked to the cold plate engagement mechanism so that motion of the cold plate engagement mechanism when it is actuated to move the cold plates also causes movement of the pluggable module locking mechanism. In other words, in these examples, the actuation of the cold plate engagement mechanism causes the actuation of the pluggable module locking mechanism via the mechanical linkage therebetween, without relying on any separate electronic control or actuation system for the pluggable module locking mechanism.

In some examples, the cold plate engagement mechanism is a manually actuated mechanism. For example, in some implementations the cold plate engagement mechanism comprises a lever which a user manually actuates to move the cold plates between engaged and disengaged state. In some examples, the pluggable module locking mechanism is mechanically linked to this same lever, such that at least some of force manually applied by the user to the lever is mechanically converted into forces which drive actuation of the pluggable module locking mechanism. In some examples, the pluggable module locking mechanism comprises a follower engaged with a cam connected to the lever so that actuation of the lever moves the cam, which in turn moves the follower. This follower is in turn coupled to the blockers that selectively block the bays. Thus, in such examples, motion of the lever is converted by the cam and follower into motion of the blockers between the locked and unlocked states. Thus, a single user action of actuating the lever causes and supplies the motive power for: (1) engaging or disengaging the cold plates, and (2) locking or unlocking the pluggable module locking mechanism.

Turning now to the figures, various devices, systems, and methods in accordance with aspects of the present disclosure will be described.

FIG. 1 is a block diagram schematically illustrating an information processing device 10. It should be understood that FIG. 1 is not intended to illustrate specific shapes, dimensions, or other structural details accurately or to scale, and that implementations of the information processing device 10 may have different numbers and arrangements of the illustrated components and may also include other parts that are not illustrated. In FIG. 1, physical engagement or linkage is indicated conceptually by dashed lines.

The information processing device 10 may be a computing device (e.g., server), networking device (e.g., switch, router, etc.), or any other device comprising information processing circuitry and configured to receive pluggable modules. As shown in FIG. 1, the information processing device 10 comprises a chassis 20, a group of pluggable module bays 30, pluggable modules 40 in the bays 30, a primary system board 45, a liquid cooling system 50, a module locking mechanism 60, and a cold plate engagement mechanism 80. These components will be described in greater detail in turn below.

The chassis 20 comprises walls, panels, brackets, and/or other support structures which support and/or house the other components of the information processing device 10. The chassis 20 supports and houses a primary system board 45, which comprises information processing circuitry such as a CPU, ASIC, or other circuitry. The group of pluggable module bays 30 may be arranged at, and may form part of, one of the panels of the chassis 20. For example, the group of pluggable module bays 30 may be part of a front panel of the chassis 20. The group of pluggable module bays 30 include multiple bays 32, with each bay 32 configured to removably receive a pluggable module 40 ("30" is used herein to refer to the group of bays as a whole, while "32" is used to refer to individual bays). Each bay 32 may comprise a connector (not illustrated) configured to connect with a complementary connector of a pluggable module 40 when the module 40 is installed in the bay 32 to communicably (e.g., electrically or optically) connect the pluggable module 40 to the primary system board 45. The bays 32 do not necessarily have to be identical to one another and neither do the pluggable modules 40 have to be identical to one another; for example, in some implementations one bay 32 is configured to receive one type of pluggable module 40 while another bay is configured to receive a different type of pluggable module 40.

Although only one group of bays 30 is illustrated to simplify the drawings, in various examples more than one group of bays 30 may be provided, each comprising one or more bays 32. In some examples in which multiple groups of bays 30 are provided, they may be provided on the same panels (e.g., first and second groups 30 both on the front panel), while in other examples they may be provided on different panels of the chassis 20 (e.g., a first group of bays 30 on a front panel, a second group of bays on a rear panel).

The pluggable modules 40 may include media drives (e.g., SSDs, HHDs) or any other pluggable modules. Non-limiting examples of form factors for pluggable media drives that may be used as the pluggable modules 40 include the form factors defined by the family of standards known as Enterprise & Data Center Standard Form Factors (EDSFF). The EDSFF standards include, but are not limited to, SFF-TA-1006, SFF-TA-1007, or SFF-TA-1008. Other examples of types of pluggable modules that may be used as the pluggable modules 40 include pluggable optical transceivers (e.g., Quad Small Form-Factor Pluggable (QSFP) connectors, Octal Small Form-Factor Pluggable (OSFP) connectors, etc.), pluggable PCIe cards, and other similar devices. In some examples, the pluggable modules 40 include ejector mechanisms 42 ("ejectors"), which are actuatable to cause ejection of an installed pluggable module 40 from a bay 32. For example, the ejectors 42 may comprise a button, a lever, a button and lever, or other mechanisms which is or are actuatable by a user to cause ejection. In some examples, the ejectors 42 may comprise a button and a lever, with the button being pressed to release the lever from a stowed position and then the lever being pulled to eject the module 40 from the bay 32.

The liquid cooling system 50 comprises cold plates 51 and a liquid cooling loop (not illustrated) configured to flow liquid coolant through the device 10. The cold plates 51 are thermally coupled to the liquid coolant. The liquid cooling loop may include a pump, coolant lines, a heat exchanger, fittings, and/or other liquid cooling components which are familiar to those of ordinary skill in the art. Some portions of the liquid cooling loop (e.g., a pump, a heat exchanger) may be separate from the information processing device 10 and may be shared by multiple such devices, while other portions (e.g., coolant lines, cold plates, etc.) may be housed within or are part of the information processing device 10. Liquid cooling systems are familiar to those of ordinary skill in the art, and thus are not shown or described in greater detail herein.

Each cold plate 51 is disposed within one of the bays 32 and is configured to be removably engaged with a pluggable module 40 installed in the bay 32. More specifically, the cold plates 51 are movable between engaged positions and disengaged positions, wherein in the engaged position each cold plate 51 is positioned to thermally contact the pluggable module 40 installed in the corresponding bay 32 (if one is present), and in the disengaged position each cold plate 51 is moved away from and is not in thermal contact with the pluggable module installed in the corresponding bay 32. References herein to the cold plates 51 thermally contacting the pluggable module 40 mean the cold plates 51 are either in direct contact with the pluggable module 40 or are indirectly in contact with the pluggable module 40 by virtue of both being in mutual contact with a thermally conductive intermediary, such as a TIM, disposed between the two.

Each cold plate 51 may be mechanically connected to a cold plate force transfer mechanism 52 which is configured to move all of the cold plates 51 in a given group of bays 30 together as a group between the engaged and disengaged positions. The cold plate force transfer mechanism 52 may be mechanically connected to a cold plate engagement mechanism 80, which is actuatable to drive engagement or disengagement of the cold plates 51. The cold plate force transfer mechanism 52 coverts motion of the cold plate engagement mechanism 80 into motion of the cold plates 51. In particular, the cold plate force transfer mechanism 52 is moveable between an engaged position and a disengaged position based on motion of the cold plate engagement mechanism 80. When the mechanism 52 is in the engaged position, the cold plates 51 are forced into their respective engaged positions. Conversely, when the mechanism 52 is in the disengaged position, the cold plates 51 are forced into their respective disengaged positions.

In some examples in which multiple groups of bays 30 are present, each group of bays 30 may be provided with a corresponding cold plate force transfer mechanism 52 and a corresponding cold plate engagement mechanism 80, so that so that the cold plates 51 of one group can be engaged or disengaged separately from the cold plates 51 of another group. For example, if a first group of bays 30 is provided with a first cold plate force transfer mechanism 52 and a first cold plate engagement mechanism 80 while a second group of bays 30 is provided with a second cold plate force transfer mechanism 52 and a second cold plate engagement mechanism 80, the cold plates 51 arranged in the first group of bays 30 may be moved between engaged and disengaged positions by actuation of the first cold plate engagement mechanism 80 without affecting the cold plates 51 arranged in the second group of bays 30, and vice versa. In the description below, only a single group of bays 30 is discussed to simplify the description, but this does not preclude the possibility of other groups of bays being present in other examples.

Figure 3:
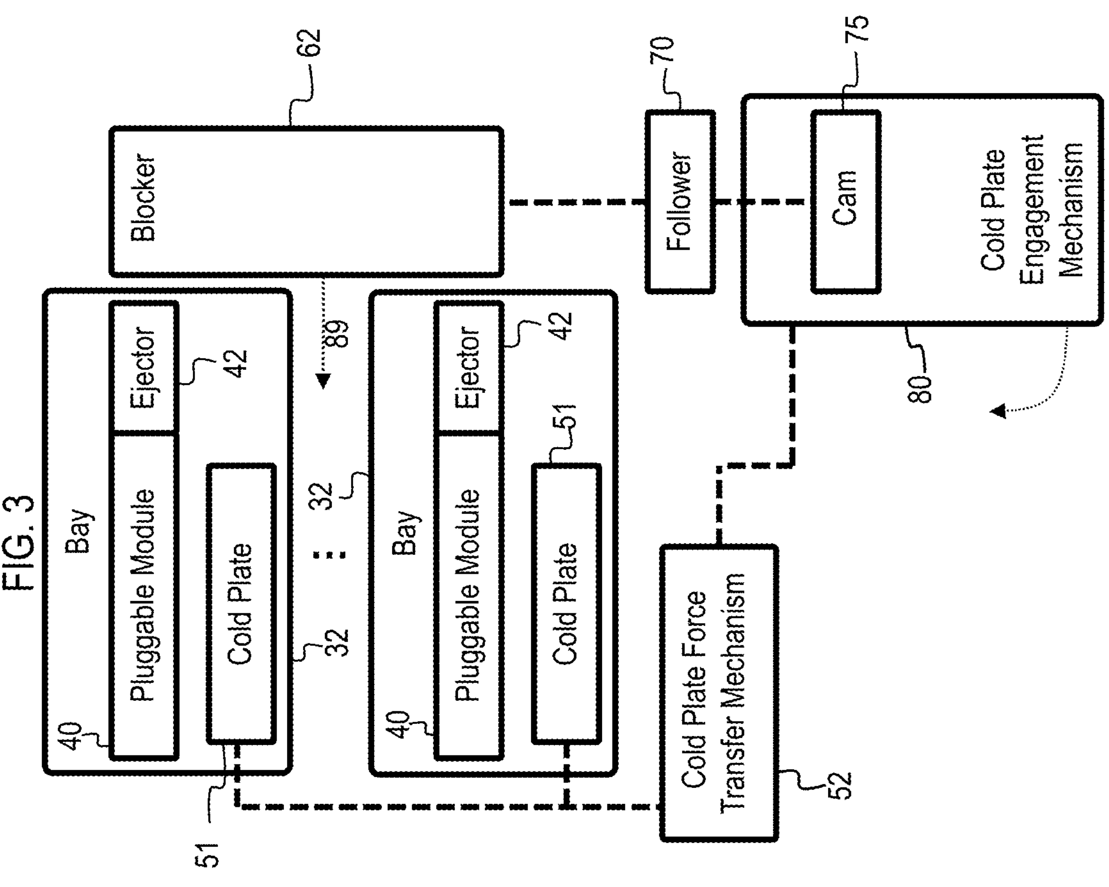
FIG. 3 is a block diagram schematically illustrating a portion of the information processing device of FIG. 1 with the pluggable module locking mechanism in an unlocked state.
Figure 2:
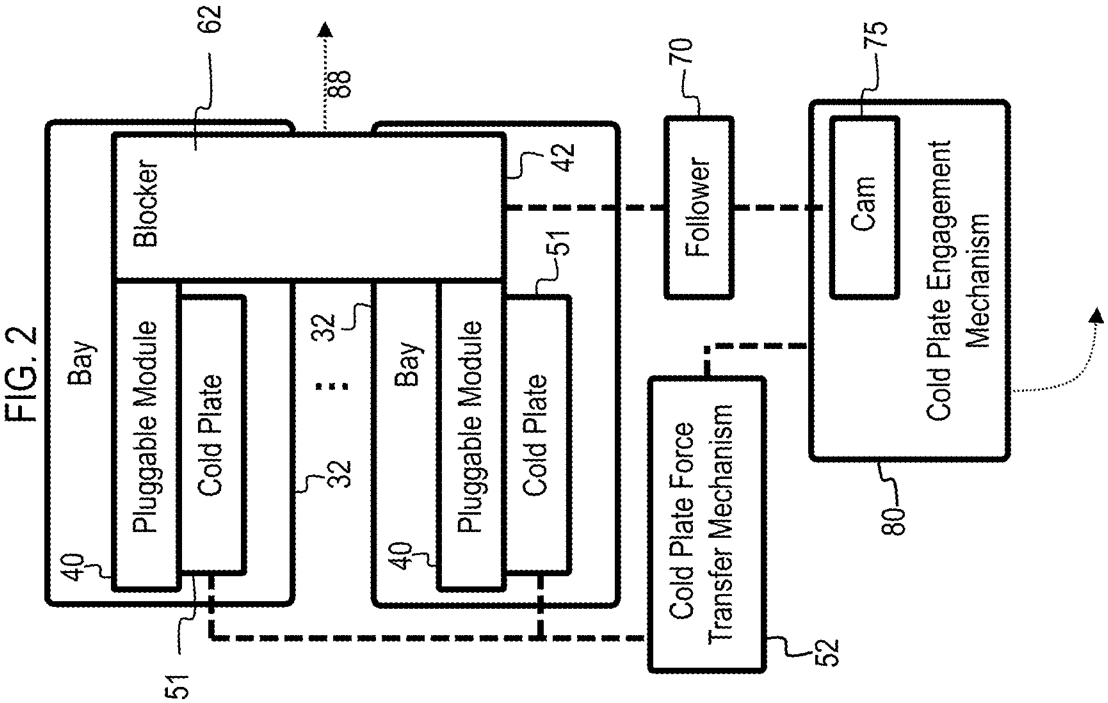
FIG. 2 is a block diagram schematically illustrating a portion of the information processing device of FIG. 1 with the pluggable module locking mechanism in a locked state.

For example, FIGS. 2 and 3 illustrate how the cold plates 51 move between the engaged and disengaged positions based on the state of the cold plate engagement mechanism 80. In FIG. 2, the mechanism 80 is in the first position, while in FIG. 3, the mechanism 80 is in the second position. As the mechanism 80 is moved from the first position (FIG. 2) to the second position (FIG. 3), the mechanism 80 forces the cold plate force transfer mechanism 52 to move into the disengaged position, which forces the cold plates 51 away from the pluggable modules 40, resulting in the state shown in FIG. 3. On the other hand, as the mechanism 80 is moved from the second position (FIG. 3) back to the first position (FIG. 2), the mechanism 80 forces (or allows) the cold plate force transfer mechanism 52 to move into its engaged position, which in turn causes the cold plates 51 to move into thermal contact with the pluggable modules 40.

In some implementations, the cold plates 51 which are coupled to the same cold plate force transfer mechanism 52 are biased towards the engaged position by biasing elements, such as springs. These biasing elements may, for example, be connected directly to the cold plate transfer mechanism 52 and bias it towards the engaged position, thereby also being the cold plates 51 coupled to the cold plate force transfer mechanism 52 to their respective engaged positions. The biasing force may also help to provide the contact pressure between the cold plates 51 and pluggable modules 40 that ensures good thermal conductivity across the thermal interface, while also allowing for some compliance between the cold plates 51 and pluggable modules 40 to account for manufacturing tolerances. In examples in which the cold plates 51 are biased towards the engaged position, the mechanism 80 and the biasing members (springs) may work together to move the cold plates 51 between the engaged and disengaged positions. More specifically, in those examples in which the cold plates 51 are biased towards the engaged position, as the mechanism 80 is moved towards the second position, it forces the mechanism 52 to move towards the disengaged position (FIG. 3), with the mechanism 80 overcoming the biasing forces that oppose this motion. The mechanism 80 will thereafter continue to hold the mechanism 52 in the disengaged position, counteracting the biasing forces, as long as the mechanism 80 remains in the second position. However, when the mechanism 80 is moved back towards the first position, the mechanism 80 ceases to hold the mechanism 52 in the disengaged position and allows the now-unopposed biasing forces to move the mechanism 52 back into the engaged position.

The pluggable module locking mechanism 60 comprises a blocking unit 61 and cam 75. The blocking unit 61 comprises one or more blockers 62 and a follower 70. The blocking unit 61 is movably connected to the chassis 20 near the group of pluggable module bays 30 such that the blocking unit 62 can be moved relative to the bays 32 between two positions associated with a locked state and an unlocked state. In the locked state, the one or more blockers 62 are positioned to collectively block each of the bays 32 of the group of bays 30. More specifically, in the locked state of the blocking unit 61, each bay 32 of the group of bays 30 is at least partially covered by one of the blockers 62 so as to block a pluggable module 40 from being inserted into the bay 32 and to block a pluggable module 40 already in the bay 32 (if one is present) from being removed therefrom. In some examples, the group of bays 30 comprises multiple columns and/or rows of bays 32, and each blocker 62 may be configured to block one column or one row of the bays 32 when in the locked state. For example, the blockers 62 may comprise vertically oriented strips in some implementations, which each cover and thus block a corresponding column of bays 32. As anther example, the blockers may comprise horizontally orientated strips in some implementations, which each cover and thus block a corresponding row of bays 32. In some implementations, the blockers 62 may also block ejectors 42 of the pluggable modules while in the locked state. In the unlocked state, the blockers 62 do not block any of the bays 32 of the group of bays 30 (and does not block the ejectors 42 of the pluggable modules 40), and thus pluggable modules 40 may be installed in or removed from the bays 32.

If more than one groups of bays 30 are present, with each having distinct groups of cold plates 51 that are actuated by distinct engagement mechanisms 80, then in some examples each such group of bays 30 may be provided with its own corresponding blocking unit 61. For example, a first blocking unit 61 may be configured to block the bays 32 of a first group of the bays 30 associated with a first mechanism 80, and a second blocking unit 61 may be configured to block the bays 32 of a second group of the bays 30 associated with a second mechanism 80. In the description below, an example with just one group of bays 30 and one blocking unit 61 is described to simplify the description.

The blocking unit 61 is movable between the locked and unlocked states in response to actuation of the cold plate engagement mechanism 80, as illustrated schematically in FIGS. 2 and 3. In other words, the state of the cold plate engagement mechanism 80 controls the state of the blocking unit 61, and a change in state of the mechanism 80 changes the state of the blocking unit 61. Specifically, if the mechanism 80 is in the first position which correspond to the cold plates 51 being engaged, the blocking unit 61 is the locked state in which the blocker 62 blocks the bays 32, as shown in FIG. 2. Conversely, if the mechanism 80 is in the second position which correspond to the cold plates 51 being disengaged, the blocking unit 61 is in the unlocked state in which the blocker 62 does not block the bays 32, as shown in FIG. 3. Moreover, motion of the mechanism 80 between the first and second positions causes motion of the blocking unit 61 between the locked and unlocked states.

The state of the cold plate engagement mechanism 80 controls the state of the blocking unit 81 because of how the follower 70 of the blocking unit 61 interacts with the cam 75 of the mechanism 80. The cam 75 is connected to the cold plate engagement mechanism 80 and thus, when the mechanism 80 is actuated, the cam 75 moves along with the mechanism 80. The follower 70 is also engaged with the cam 75 such that, as the cam 75 moves, the follower 70 also moves. The follower is connected to the blockers 62, and thus the motion of the follower 70, as driven by the cam 75 and the mechanism 80 to which the cam 75 is connected, causes motion of the blockers 62.

In particular, if the mechanism 80 is moved from the second position (FIG. 3) to the first position (FIG. 2), this causes the cam 75 to move in a manner that forces the follower 70 to move along a first direction 89 towards the locked state, resulting in the blocker 62 being moved to cover the bays 32, as shown in FIG. 2. Conversely, if the mechanism 80 is moved from the first position (FIG. 2) to the second position (FIG. 3), this causes the cam 75 to move in a manner that forces the follower 70 to move along a second direction 88 towards the unlocked state, resulting in the blocker 62 being moved away from the bays 32, as shown in FIG. 3.

Thus, as a user actuates the mechanism 80 to disengage the cold plates 51, the locking mechanism 60 automatically moves to the unlocked state in response to the same motion of the mechanism 80. Conversely, as the user actuates the mechanism 80 to engage the cold plates 51, the locking mechanism 60 automatically moves to the locked state in response to the same motion of the mechanism 80. Thus, a user cannot inadvertently remove a module 40 or install a new module 40 while the cold plates 51 are engaged, because the locking mechanism 60 physically blocks insertion or removal of a module 40 whenever the cold plates 51 are in the engaged position. Moreover, a single motion, i.e., actuation for the mechanism 80, achieves two tasks concurrently: engaging/disengaging the cold plates 51, and locking/unlocking the locking mechanism 60.

Turning now to FIGS. 4-15, another example information processing device 110 will be described. The information processing device 110 is one example configuration of the information processing device 10. Thus, some components of the information processing device 110 correspond to (i.e., are the same as, similar to, and/or example configurations of) components of the information processing device 10 described above. The components of the information processing device 110 and the components of the information processing device 10 which correspond to one another are given reference numbers with the same last two digits, such as 20 and 120. The descriptions above of the components of the information processing device 10 are applicable to the corresponding components of the information processing device 110 110 (unless otherwise indicated or logically contradictory), and thus duplicative descriptions of some aspects already described above are omitted below.

FIGS. 4-15 show the information processing device 110 in various perspectives and in various states, and aspects of the information processing device 110 may be visible in multiple of the figures. The description below will refer to the figures as and when they are relevant to the aspect being described, rather than in strict numerical order.

As shown in FIGS. 4-7, the information processing device comprises a chassis 120, a group of pluggable module bays 130, pluggable modules 140, a primary system board (not visible), a liquid cooling system 150, a module locking mechanism 160, and a cold plate engagement mechanism 180. In this example implementation, the information processing device 110 is a computing device and the pluggable modules 140 comprise pluggable media drives (e.g., SSDs). In this example implementation, the cold plate engagement mechanism 180 is a lever, and accordingly, the cold plate engagement mechanism 180 may be referred to interchangeably as "lever 180" or as "cold plate engagement lever 180".

The chassis 120 comprises a plurality of walls or panels including a front panel 121, as well as top, bottom, left, right, and back walls/panels. The chassis 120 may also comprise brackets, and/or other support structures (not labeled). The chassis 120 supports and houses the primary system board, which comprises information processing circuitry such as a CPU, ASIC, or other circuitry.

As shown in FIGS. 4-7, the pluggable module bays 130 are arranged at, and form part of, the front panel 121 of the chassis 120. The pluggable module bays 130 include multiple bays 132, with each bay 132 configured to removably receive a pluggable module 140 ("130" refers to the group of bays collectively, while "132" refers to individual bay). Each bay 132 may comprise a connector (not illustrated) configured to connect with a complementary connector of a pluggable module 140 when the module 140 is installed in the bay 132 to communicably (e.g., electrically or optically) connect the pluggable module 140 to the primary system board. In the example illustrated in FIGS. 4-7, the group of bays 130 comprises an array with three columns 131 of bays 132, including a first column 131-1, a second column 131-2, and a third column 131-3. This is merely one example, and in other implementations the bays 132 may be arranged differently, including with more or fewer bays 132, more or fewer columns, and/or more or fewer rows.

Figure 5:
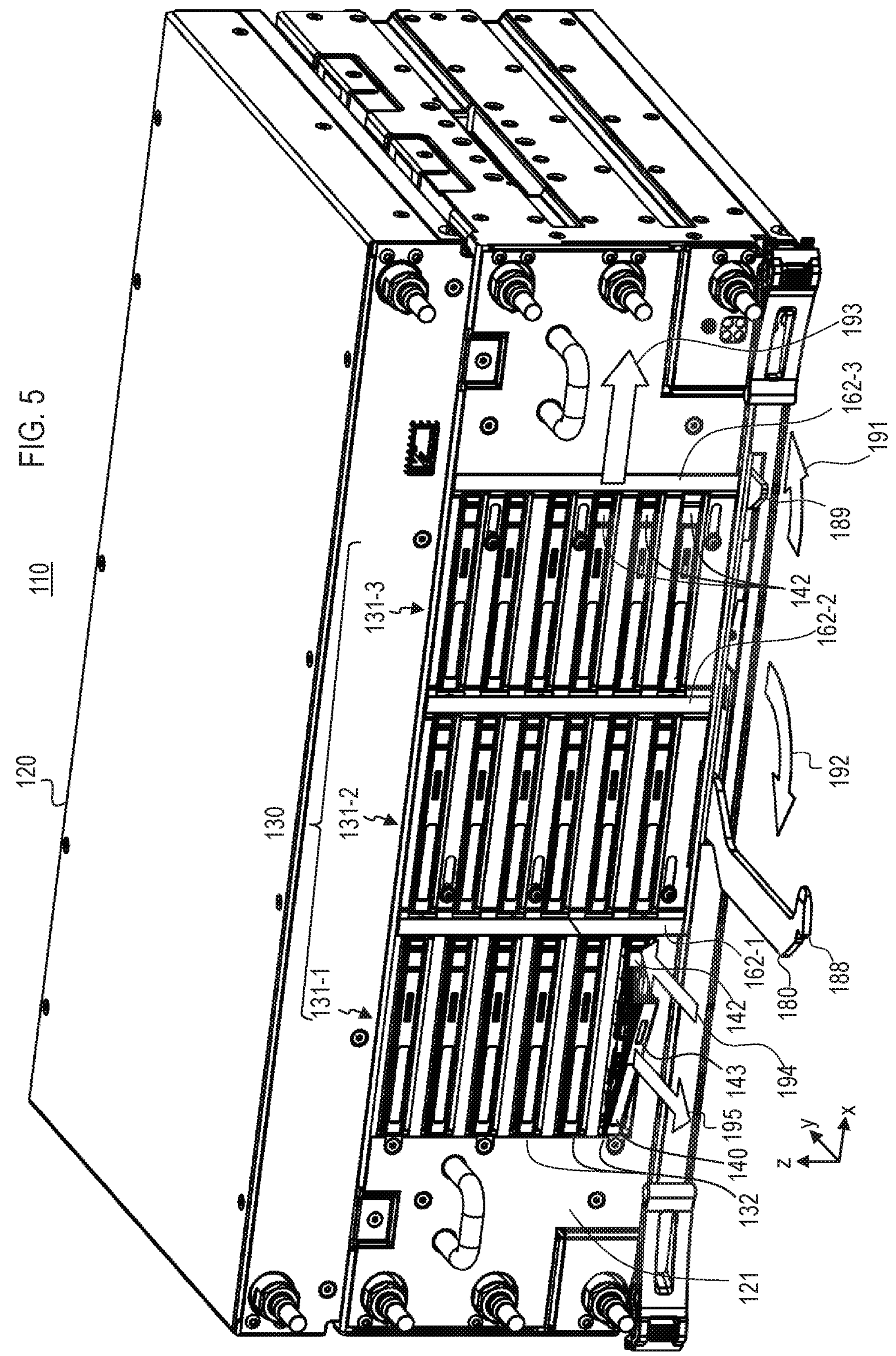
FIG. 5 is a perspective view of the information processing device of FIG. 4 with the pluggable module locking mechanism in an unlocked state.

As noted above, in this example the pluggable modules 140 may include media drives. The pluggable modules 140 also include ejector mechanisms comprising both an ejector button 142 and an ejector lever 143. As shown in FIG. 5, a pluggable module 140 is ejected by pressing in on the ejector button 142 (see arrow 194), which releases the lever 143 from a stowed position. Next, the now-released lever 143 may be pulled outward (see arrow 195), which generates a force applied against the chassis 120 which pushes to the module 140 along the −y direction and causes the pluggable module 140 to disconnect from the electrical connectors in the bay 132 and to move part of the way out of the bay 132, whereupon the user may grasp the pluggable module 140 and remove the module 140 the rest of the way out of the bay 132.

Figure 15:
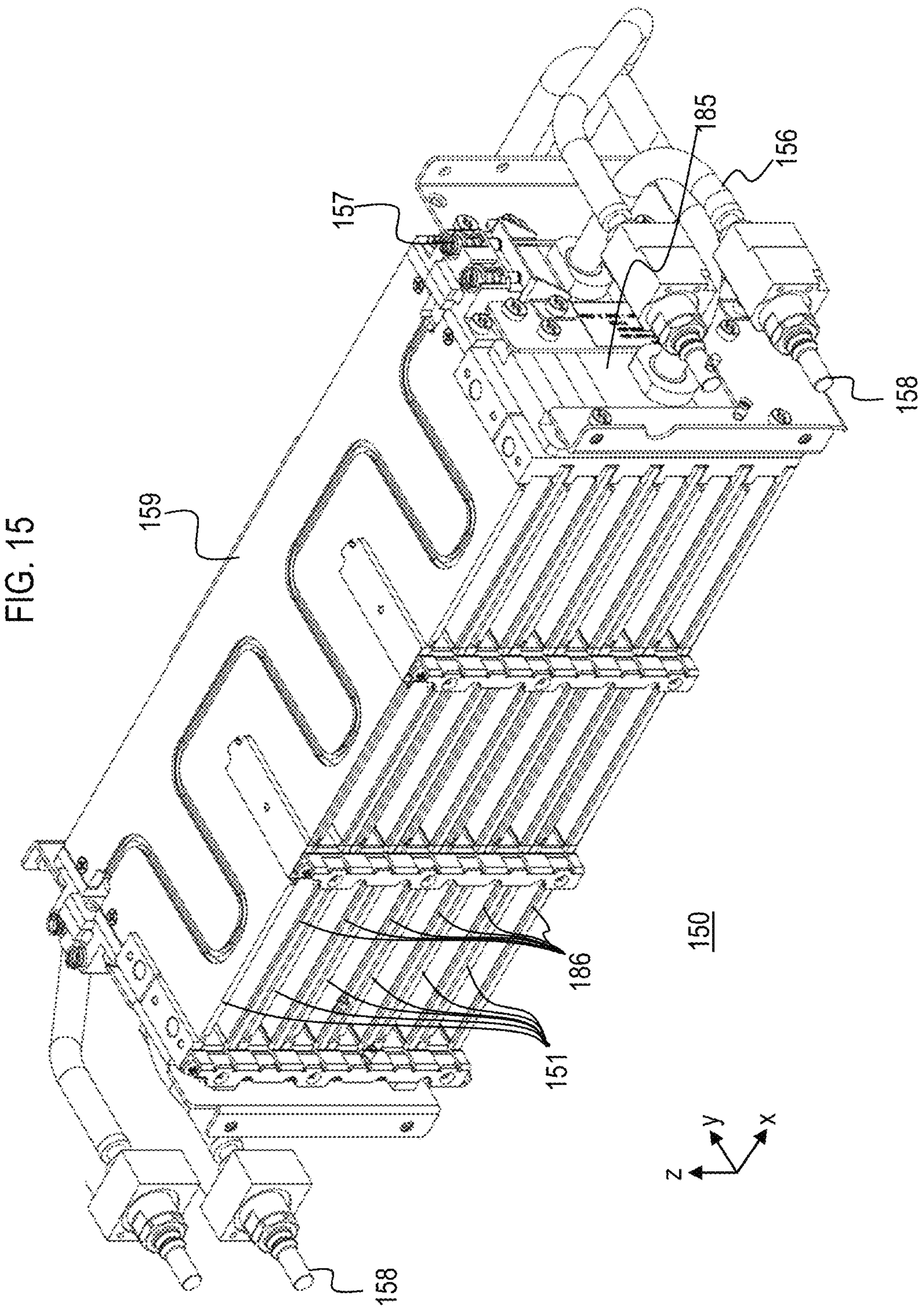
FIG. 15 is a perspective view of a liquid cooling system of the information processing device of FIG. 4.

As shown in FIG. 15, the liquid cooling system 150 comprises cold plates 151 and a liquid cooling loop comprising fluid couplers 158 and fluid conduits 156 configured to flow liquid coolant through the device 110. The cold plates 151 are all connected together to form a first cold plate unit 159, which is movable together in vertical (+/−z) directions. The first cold plate unit 159 is thermally coupled with the liquid coolant carried in the fluid conduits 156. As described in greater detail below, the cold plate engagement lever 180 is actuatable to drive the motion of the cold plates 151. Each cold plate 151 is disposed within one of the bays 132 and is configured to be removably engaged with a pluggable module 140 installed in the bay 132. More specifically, the cold plates 151 are positioned above the modules 140 and are movable in the +z and −z direction to move between the engaged positions and disengaged positions. The cold plate unit 159 is moved downward (−z direction) to engage with the cold plates 151 with the pluggable modules 140. The cold plate unit 159 is moved upward (+z direction) to disengage the cold plates 151 from the pluggable modules 140.

In some examples, the liquid cooling system 150 includes a second cold plate unit 185 comprising cold plates 186. The second cold plate unit 185 is fixed relative to the chassis 120 and does not move when the lever 180 is actuated. In these examples, the pluggable modules are disposed in the spaces between the cold plates 186 and 151, with each cold plate 186 located below a corresponding pluggable module and each cold plate 151 being located above a corresponding pluggable module. When the first cold plate unit 159 is moved downward, the pluggable module is clamped between the cold plates 186 and 151. When the first cold plate unit 159 is moved upward, the pluggable modules are no longer clamped by the cold plates 186 and 151. This example of the liquid cooling system 150 is just one example implementation, and the pluggable module locking mechanism 160 disclose wherein can be used with any other type of liquid cooling system. In particular, in other examples, the liquid cooling system may comprise one set of cold plates that are movable but comprises no fixed cold plates.

Figure 9:
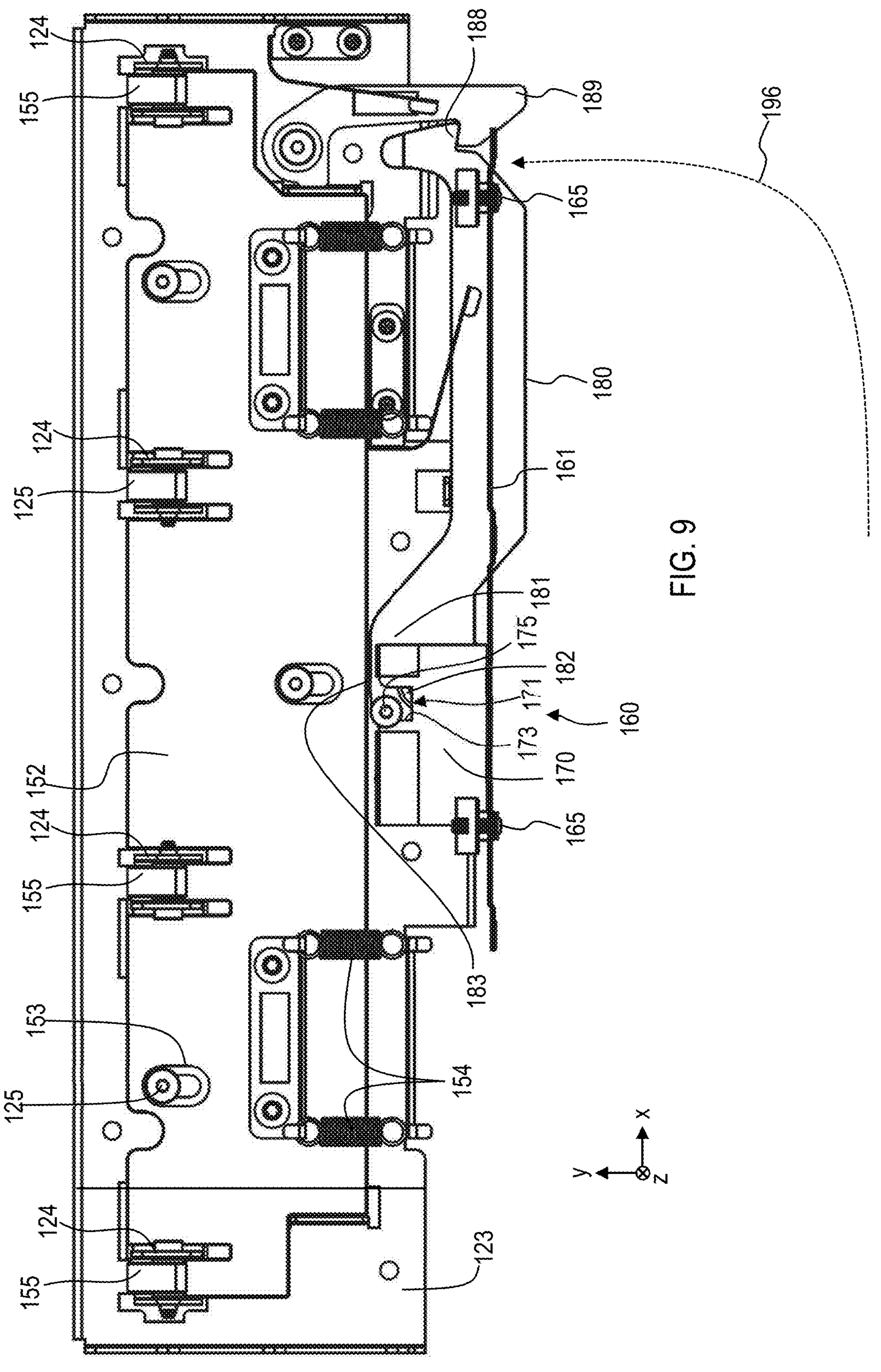
FIG. 9 is a plan view of a portion of the information processing device of FIG. 4 comprising the cold plate engagement lever, the cold plate force transfer mechanism, and the pluggable module locking mechanism in the locked state.
Figure 10:
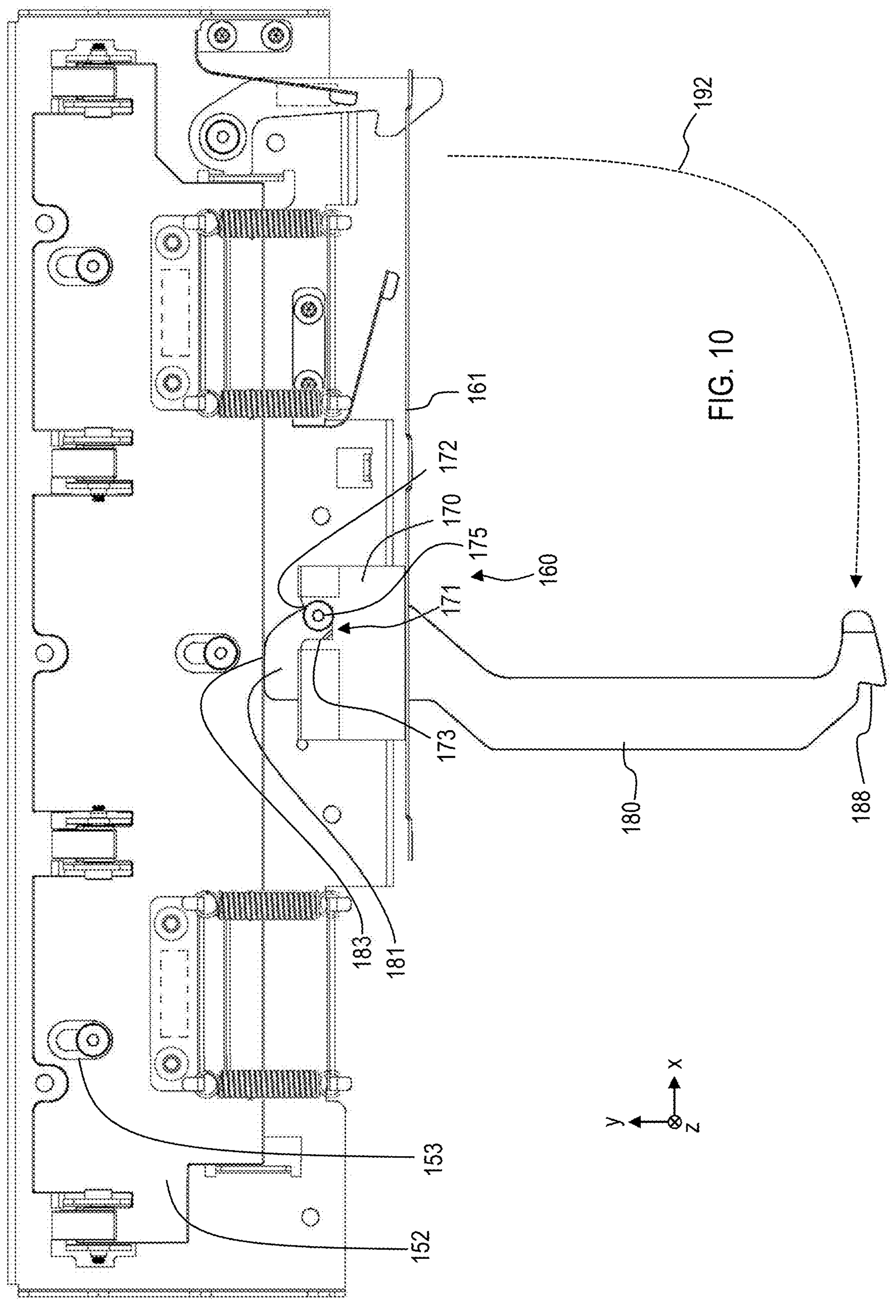
FIG. 10 is a partial plan view of a portion of the information processing device of FIG. 4 comprising the cold plate engagement lever, the cold plate force transfer mechanism, and the pluggable module locking mechanism in the unlocked state.
Figure 11:
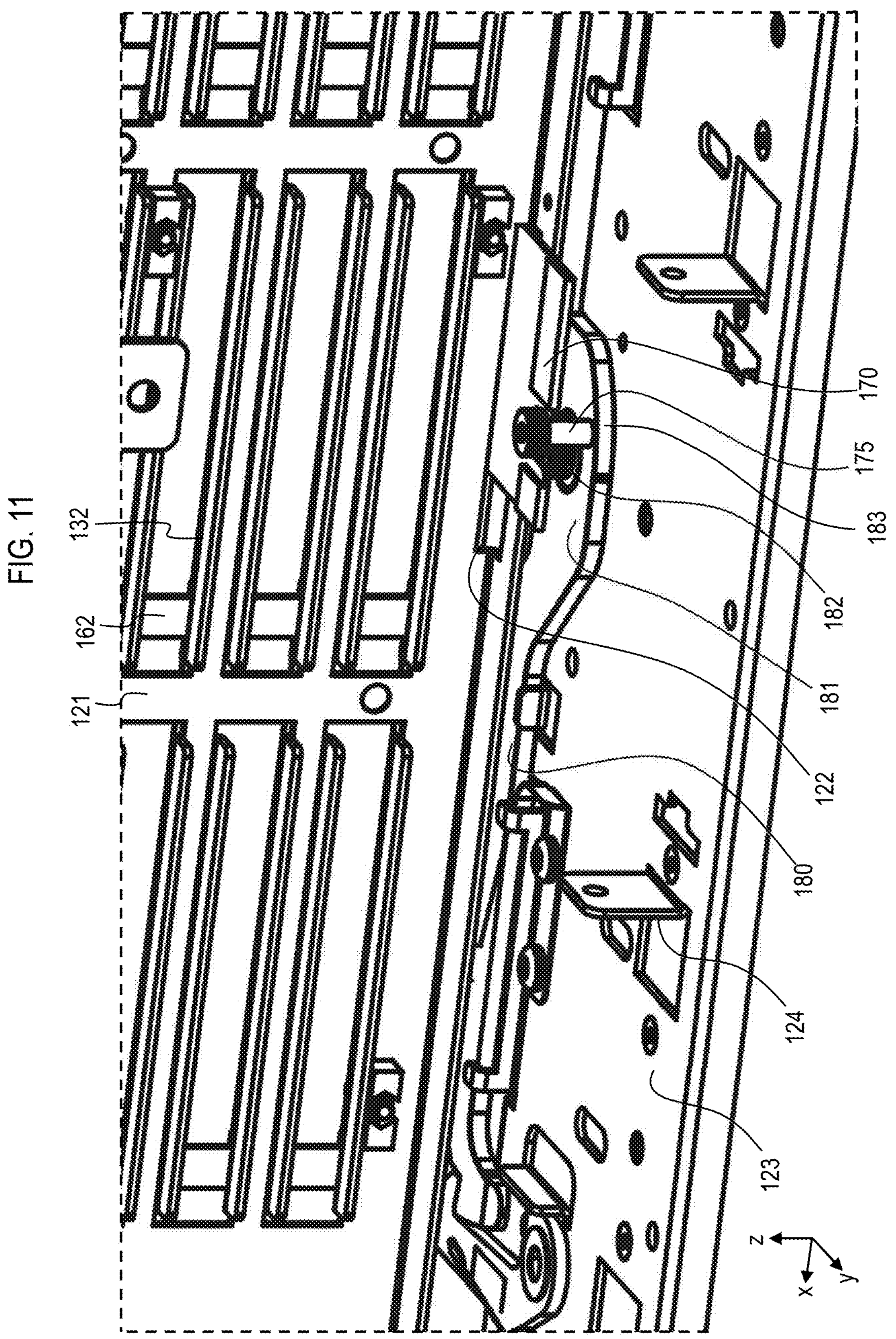
FIG. 11 is a perspective view of an interior portion of the information processing device of FIG. 4 with pluggable modules omitted and with the pluggable module locking mechanism in the locked state.
Figure 13:
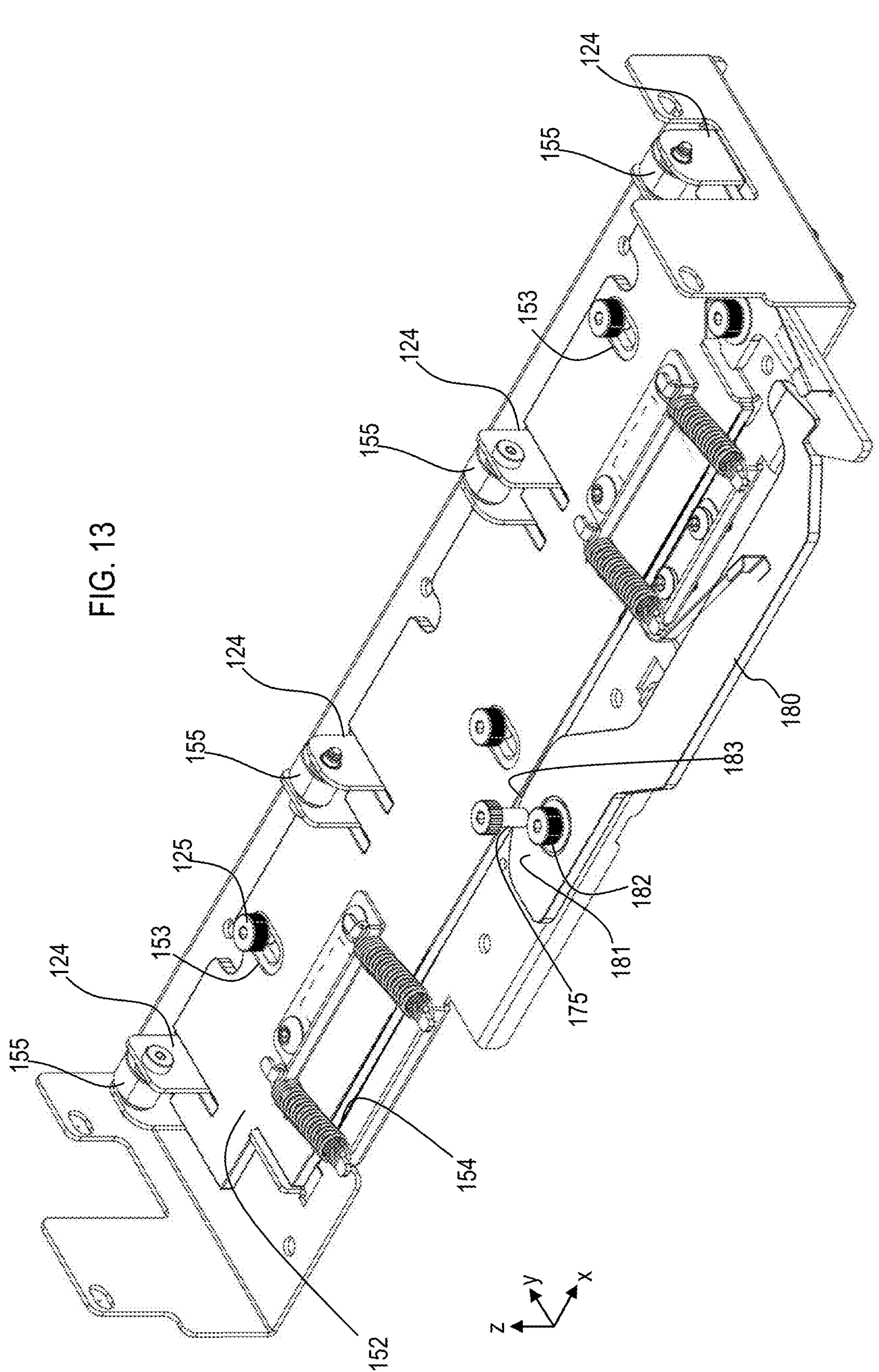
FIG. 13 is a perspective view of a cold plate force transfer mechanism and a cold plate engagement lever of the information processing device of FIG. 4 with the cold plate force transfer mechanism in an engaged position.
Figure 14:
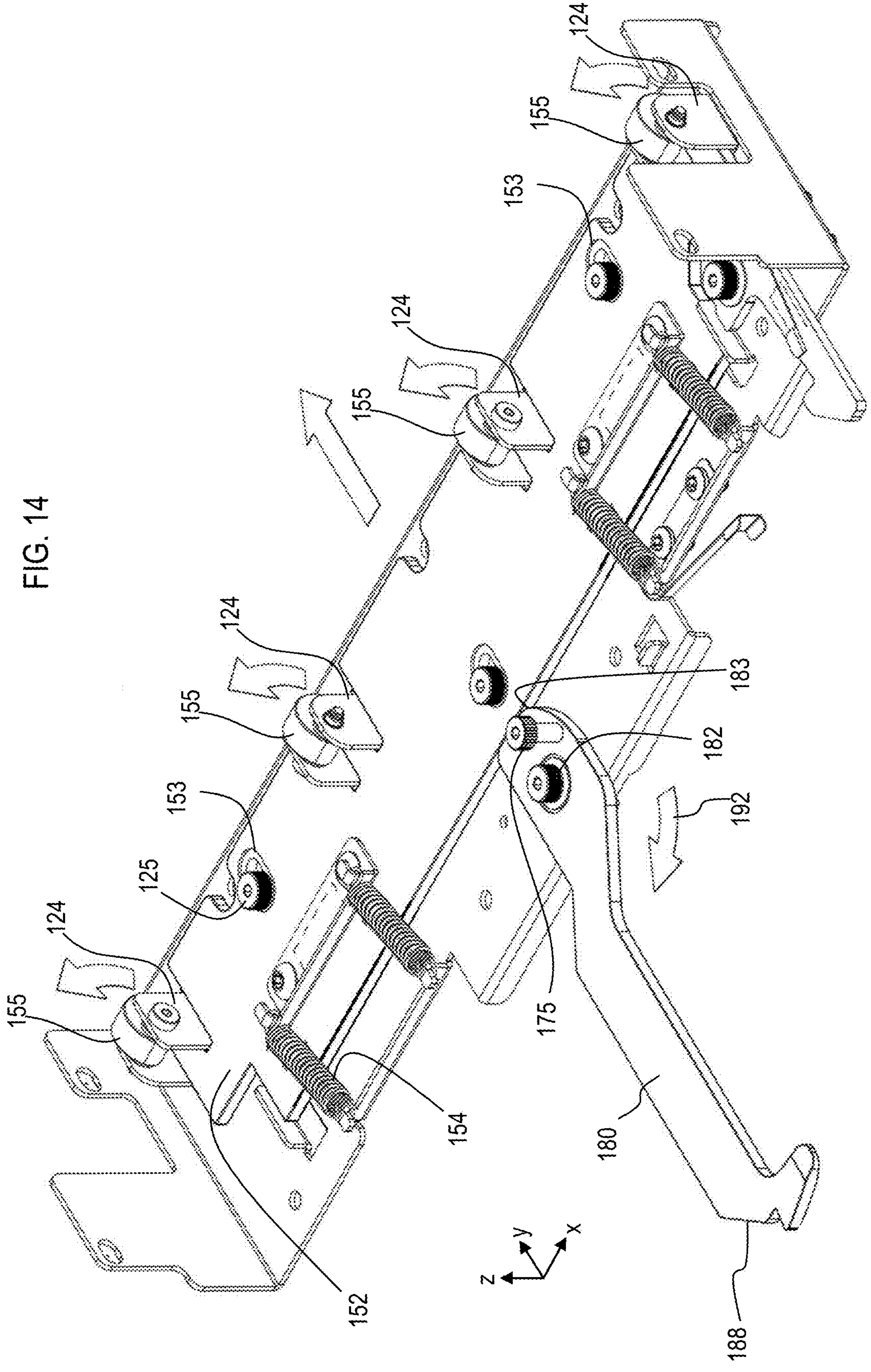
FIG. 14 is a perspective view of cold plate force transfer mechanism and cold plate engagement lever of the information processing device of FIG. 4 with the cold plate force transfer mechanism in a disengaged position.

As shown in FIGS. 9, 10, 13 and 14, the device 110 comprises a cold plate force transfer mechanism 152, which is configured to move all of the movable cold plates 151 in the group of bays 130 together as a group between the engaged and disengaged positions. In the illustrated example, the cold plate force transfer mechanism 152 comprises a plate-like structure which is oriented horizontally and positioned below the group of bays 130 in the chassis 120. The cold plate force transfer mechanism 152 is movably coupled to a horizontal support member 123 of the chassis 120 via slots 153 and spools 125 engaged with the slots 153, and these allow the cold plate force transfer mechanism 152 to move horizontally along the +/−y directions. FIGS. 9 and 13 illustrate the cold plate force transfer mechanism 152 in an engaged position, while FIGS. 10 and 14 illustrates the cold plate force transfer mechanism 152 in a disengaged position. In this example, the disengaged position (FIGS. 10 and 14) is farther in the +y direction than is the engaged position (FIGS. 9 and 13). The cold plate force transfer mechanism 152 is engaged with eccentric wheels 155, which are attached to the horizontal support member 123 by brackets 124, as shown in FIGS. 9, 10, 13, and 14. As shown in FIG. 11, the brackets 124 are coupled to and extend vertically from the horizontal support member 123. Returning to FIGS. 9, 10, 13, and 14 as the cold plate force transfer mechanism 152 is moved between the engaged and disengaged positions, it engages with and moves the eccentric wheels 155. The cold plate unit 159 rests upon and is vertically supported by eccentric wheels 155. Thus, the movement of the eccentric wheels 125 causes vertical (+/−z direction) motion of the cold plates 151. In particular, when the cold plate force transfer mechanism 152 is in the engaged position (FIGS. 9 and 13), the eccentric wheels 155 are at a low position and cold plate unit 159 thus is at its lowest position, which corresponds to the engaged position of the cold plates 151. When the cold plate force transfer mechanism 152 is in the disengaged position (FIGS. 10 and 14), the eccentric wheels 155 are at a raised position and cold plate unit 159 thus raised to its highest position, which corresponds to the cold plates 151 being in the disengaged position. Springs 154 are coupled to the cold plate force transfer mechanism 152 and to the horizontal support mechanism 152, and these springs 154 apply biasing forces that bias the cold plate force transfer mechanism 152 towards the disengaged position show in FIG. 9. In addition, as shown in FIG. 15, spring loaded shoulder screws 157 may movably couple the first cold plate unit 159 to the second cold plate unit 185, and these spring loaded shoulder screws 157 may bias the cold plate unit 159 (and hence each of the cold plates 151) to the engaged position. Gravity, as well, also provides some biasing of the cold plate 151 toward the engaged position.

FIGS. 9,10, 13, and 14 illustrate how the cold plate force transfer mechanism 152 is moved between the engaged and disengaged positions based on the state of the cold plate engagement lever 180. The lever 180 is pivotable above a pivot 182. Moreover, the lever 180 comprises a cam surface 183 which abuts a forward (−y direction) facing edge of the cold plate force transfer mechanism 152. This cam surface 183 moves as the lever 180 is actuated, protruding more or less in the y-direction depending on the orientation of the lever. The position of the cold plate force transfer mechanism 152 is controlled by the position of the cam surface 183, and thus by the orientation of the lever 180. In particular, when the lever 180 is at a first position illustrated in FIG. 9, the cam surface 183 protrudes only a small distance in the +y direction, and thus the cam surface 183 allows the cold plate force transfer mechanism 152 to be positioned in its farthest forward (−y direction) position, which corresponds to the engaged position of the cold plate force transfer mechanism 152. As the lever 180 is actuated from this first position to a second position shown in FIG. 10, the proximal end 181 of the lever 180 rotates and the cam surface 183 begins to protrude farther and farther into the +y direction, and thus the cam surface 183 begins to force the cold plate force transfer mechanism 152 to move in the +y direction. The springs 154 resist this motion, but forces applied by the user to the lever 180 may overcome the biasing forces of the springs 154. Eventually, the lever 180 reaches the second position (FIG. 10), and in this position the cold plate force transfer mechanism 152 is at its farthest extend in the +y direction, which corresponds to the disengaged position.

The lever 180 is movable between the first and second positions by moving the distal end 188 of the lever 180 towards or away from the chassis 120, causing the lever 180 to pivot about the pivot 182. A latch 189 may engage the distal end 188 when the lever 180 is in the first position, as shown in FIG. 9. A user may disengage the latch 189 prior to moving the lever 180 from the first position to the second position. Upon moving the lever 180 from the second position to the first position, the latch 189 may automatically engage.

Figure 12:
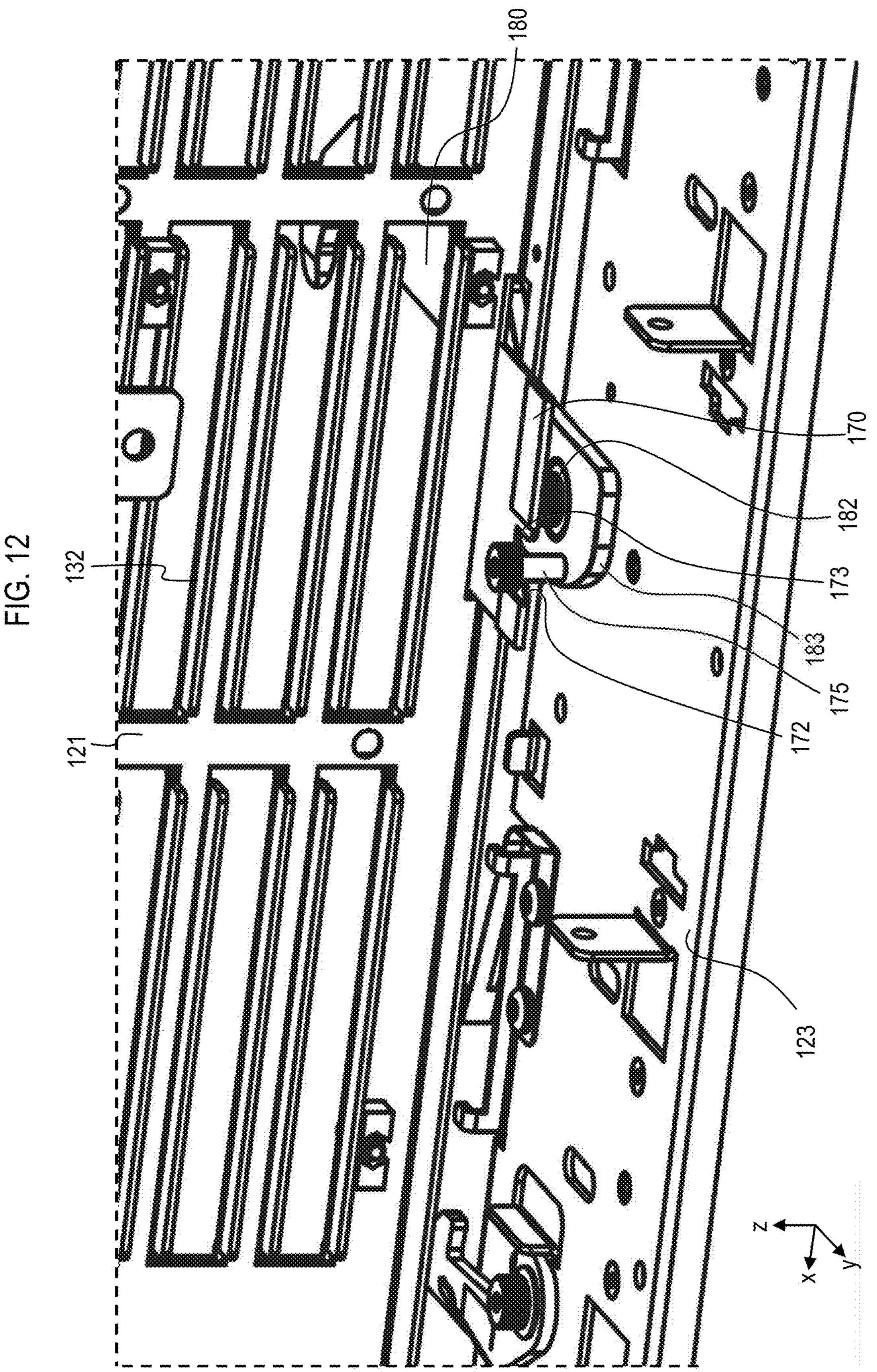
FIG. 12 is a perspective view of an interior portion of the information processing device of FIG. 4 with pluggable modules omitted with the pluggable module locking mechanism in the unlocked state.

As shown in FIGS. 4-8, the pluggable module locking mechanism 160 comprises a blocking unit 161. The pluggable module locking mechanism 160 also comprises a cam 175, which is described in greater detail below in relation to FIGS. 9-12. Returning to FIG. 8, the blocking unit 161 comprises a plurality of blockers 162 and a follower 170. As shown in FIGS. 4-7, the blockers 162 of the blocking unit 161 are disposed on an exterior side of the front panel 121, whereas the follower 170 is disposed on the interior side of the front panel 121, as shown in FIGS. 11 and 12. As shown in FIGS. 4-8, the blockers 162 comprise strips that extend vertically. Moreover, each of the blockers 162 corresponds to one of the columns 131 of bays 132—i.e., the blocker 162-1 corresponds to the column 131-1, the blocker 162-2 corresponds to the column 131-2, and the blocker 162-3 corresponds to the column 131-3. Each blocker 162 is configured to selectively block the corresponding column 131 of bays 132, as will be described in greater detail below. The blocking unit 161 further comprises horizontal strips 163, 166, and 168 which connect to the vertical blockers 162. As shown in FIGS. 4-7, the base horizontal strip 163 is positioned below the pluggable modules 140, the horizontal strips 166 are positioned in the region between vertically adjacent pluggable modules 140, and the top horizontal strip 168 is positioned above the pluggable modules 140.

Figure 6:
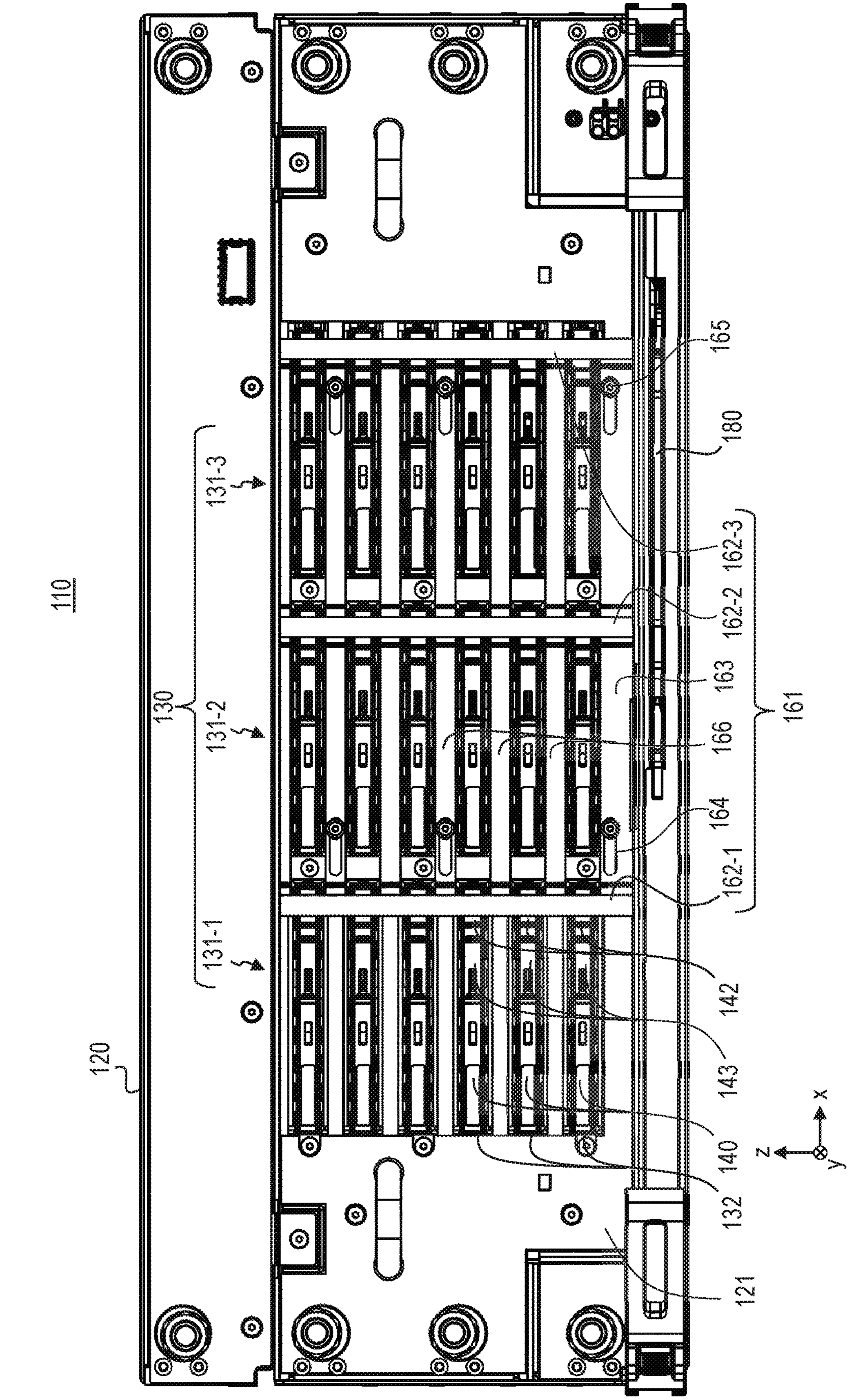
FIG. 6 is a front view of the information processing device of FIG. 4 with the pluggable module locking mechanism in the locked state.
Figure 7:
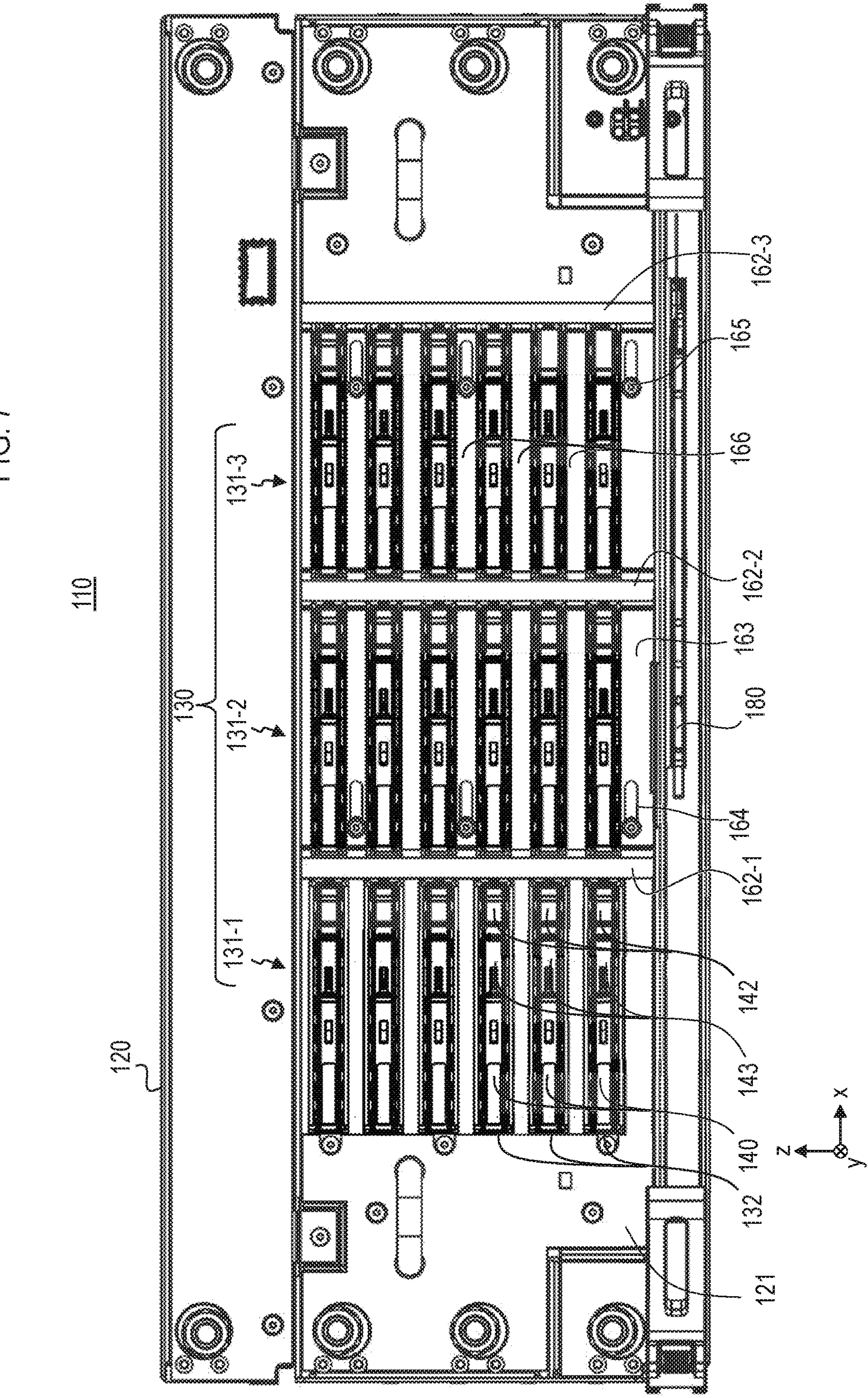
FIG. 7 is a front view of the information processing device of FIG. 4 with the pluggable module locking mechanism in the unlocked state.

As shown in FIGS. 4-7, the blocking unit 161 is movably connected to the front panel 121 of the chassis 120 near the group of pluggable module bays 130. The blocking unit 161 is coupled to the front panel 121 via slots 164 disposed in the horizontal strips 163, 166, and/or 168, which engage with fasteners 165 coupled to the front panel 121 so as to allow the blocking unit 161 to slide horizontally along +/−x directions. Thus, the blocking unit 161 can be moved relative to the bays 132 between two positions associated with a locked state (FIGS. 4 and 6) and an unlocked state (FIGS. 5 and 7).

Figure 4:
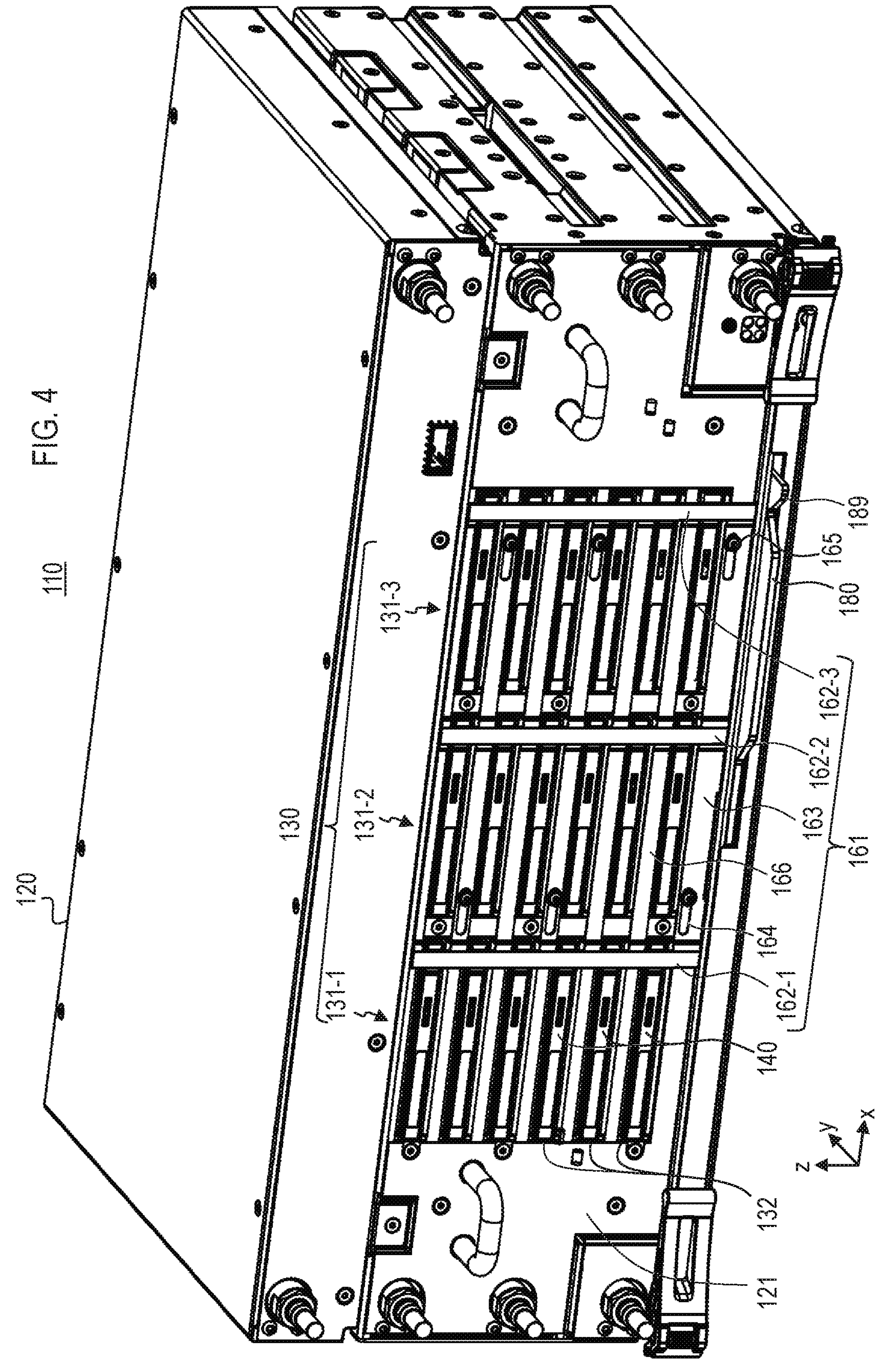
FIG. 4 is a perspective view of another example information processing device with a pluggable module locking mechanism in a locked state.

As shown in FIGS. 4 and 6, in the locked state, each of the blockers 162 is positioned so as to cover a portion of each one of the bays 132 in corresponding column 131—i.e., the blocker 162-1 blocks the bays 132 in the column 131-1, the blocker 162-2 blocks the bays 132 in the column 131-2, and the blocker 162-3 blocks the bays 132 in the column 131-3. Thus, the blockers 162 of the blocker unit 161 collectively block all of the bays 132 of the group of bays 130. More specifically, the blockers 162 block the ejector buttons 142 of the pluggable modules when in the locked state. Thus, in this locked state, none of the pluggable modules 140 can be removed from any of the bays 132 in the group of bays 130, and no pluggable modules 140 can be installed into any of the bays 132 in the group of bays 130.

As shown in FIGS. 5 and 7, in the unlocked state, the blockers 162 do not block any of the bays 132 of the group of bays 130 and thus pluggable modules 140 may be installed in or removed from the bays 132. Specifically, in this state, the blockers 162 are positioned laterally to the side of the bays 132, with the blockers 162-1 and 162-2 being positioned between adjacent columns 131 of bays 132 and the blocker 162-3 being positioned to the side of the group of bays 130.

The blocking unit 161 is movable between the locked and unlocked states in response to actuation of the cold plate engagement mechanism 180. In other words, the state of the cold plate engagement mechanism 180 controls the state of the blocking unit 161, and a change in state of the mechanism 180 changes the state of the blocking unit 161. Specifically, as shown in FIG. 4, if the mechanism 180 is in the first position which correspond to the cold plates 151 being engaged, the blocking unit 161 is the locked state in which the blocker 162 blocks the bays 132. Conversely, as shown in FIG. 5, if the mechanism 180 is in the second position which correspond to the cold plates 151 being disengaged, the blocking unit 161 is in the unlocked state in which the blocker 162 does not block the bays 132. Moreover, motion of the mechanism 180 between the first and second positions causes motion of the blocking unit 161 between the locked and unlocked states.

Figure 8:
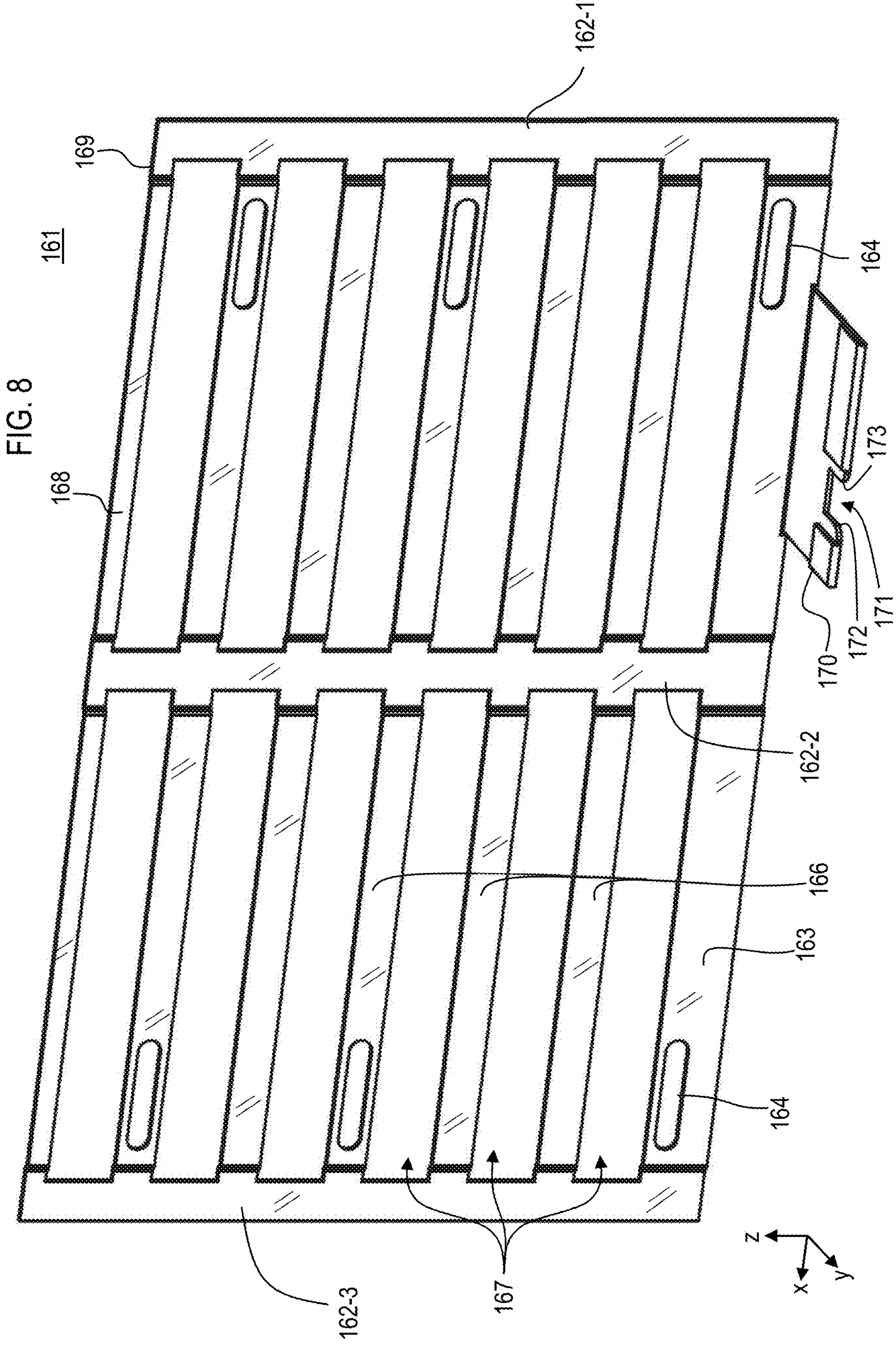
FIG. 8 is a perspective view of a blocking unit of the pluggable module locking mechanism of the information processing device of FIG. 4.

The state of the cold plate engagement mechanism 180 controls the state of the blocking unit 161 because of how the follower 170 of the blocking unit 161 interacts with the cam 175 of the mechanism 180. As shown in FIGS. 9-12, the cam 175 is connected to the cold plate engagement mechanism 180 and thus, when the mechanism 180 is actuated, the cam 175 moves along with the mechanism 180. The follower 170 comprises a channel 171 through which the cam 175 extends. The channel 171 has a first wall side 173 (see FIGS. 9 and 12) and a second side wall 172 (see FIGS. 10 and 12), and as the cam 175 moves it engages and pushes against these walls 172 and 173. Thus, as the cam 175 moves, the follower 170 also moves. As shown in FIG. 8, the follower is connected to the blockers 162. In particular, the blockers 162 are on the outside of the front panel 121 while the follower 170 is on the inside of the chassis 120, and the follower 170 extends through the front panel 121 via slot 122, as shown in FIG. 11. Thus, the motion of the follower 170, as driven by the motion of the cam 175 and (ultimately) the motion of the mechanism 180, causes the motion of the blockers 162.

More specifically, as the lever 180 is moved in the direction 192 indicated in FIG. 10 from the first position to the second position, the proximal end 181 of the lever 180 rotates causing the cam 175 to move along an arc in a generally +x direction (the arc is clockwise in the orientation of FIG. 10). The cam 175 moving in the generally +x direction eventually collides with the second wall 172, and the cam 175 begins pushing the follower 170 in the +x direction. Although the cam 175 moves in an arc, the follower 170 translates linearly along the x axis. Eventually, when the lever 180 reaches the second position (FIGS. 10 and 12), the follower 170 achieves its farthest extent of travel in the +x direction, which corresponds to the unlocked position of the blocking unit 161.

Conversely, as the lever 180 is moved in the opposite direction of 196 (see FIG. 9) from the second position towards the first position, the cam 175 moves in along an arc in a generally −x direction (the arc is counterclockwise in the orientation of FIG. 9). The cam 175 moving in the generally −x direction eventually collides with the first wall 173, and the cam 175 begins pushing the follower 170 in the −x direction. Eventually, when the lever 180 reaches the first position (FIGS. 9 and 11), the follower 170 achieves its farthest extend of travel in the −x direction, which corresponds to the locked position of the blocking unit 161.

Thus, as a user actuates the mechanism 180 in the direction 192 to disengage the cold plates, the locking mechanism 160 automatically moves to the unlocked state in response to the same motion of the mechanism 180. Conversely, as the user actuates the mechanism 180 in the direction 193 to engage the cold plates, the locking mechanism 160 automatically moves to the locked state in response to the same motion of the mechanism 180. Thus, a user cannot inadvertently remove a module 140 or install a new module 140 while the cold plates are engaged, because the locking mechanism 160 physically blocks insertion or removal of a module 140 whenever the cold plates 51 are in the engaged position. Moreover, a single motion, i.e., actuation for the mechanism 180, achieves two tasks concurrently: engaging/disengaging the cold plates, and locking/unlocking the locking mechanism 160.

In the description above, various types of electronic circuitry are described. As used herein, “electronic” is intended to be understood broadly to include all types of circuitry utilizing electricity, including digital and analog circuitry, direct current (DC) and alternating current (AC) circuitry, and circuitry for converting electricity into another form of energy and circuitry for using electricity to perform other functions. In other words, as used herein there is no distinction between “electronic” circuitry and “electrical” circuitry.

It is to be understood that both the general description and the detailed description provide examples that are explanatory in nature and are intended to provide an understanding of the present disclosure without limiting the scope of the present disclosure. Various mechanical, compositional, structural, electronic, and operational changes may be made without departing from the scope of this description and the claims. In some instances, well-known circuits, structures, and techniques have not been shown or described in detail in order not to obscure the examples. Like numbers in two or more figures represent the same or similar elements.

In addition, the singular forms “a”, “an”, and “the” are intended to include the plural forms as well, unless the context indicates otherwise. Moreover, the terms “comprises”, “comprising”, “includes”, and the like specify the presence of stated features, steps, operations, elements, and/or components but do not preclude the presence or addition of one or more other features, steps, operations, elements, components, and/or groups. Components described as connected may be electronically or mechanically directly connected, or they may be indirectly connected via one or more intermediate components, unless specifically noted otherwise. Mathematical and geometric terms are not necessarily intended to be used in accordance with their strict definitions unless the context of the description indicates otherwise, because a person having ordinary skill in the art would understand that, for example, a substantially similar element that functions in a substantially similar way could easily fall within the scope of a descriptive term even though the term also has a strict definition.

And/or: Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}".

Elements and their associated aspects that are described in detail with reference to one example may, whenever practical, be included in other examples in which they are not specifically shown or described. For example, if an element is described in detail with reference to one example and is not described with reference to a second example, the element may nevertheless be claimed as included in the second example.

Unless otherwise noted herein or implied by the context, when terms of approximation such as "substantially," "approximately," "about," "around," "roughly," and the like, are used, this should be understood as meaning that mathematical exactitude is not required and that instead a range of variation is being referred to that includes but is not strictly limited to the stated value, property, or relationship. In particular, in addition to any ranges explicitly stated herein (if any), the range of variation implied by the usage of such a term of approximation includes at least any inconsequential variations and also those variations that are typical in the relevant art for the type of item in question due to manufacturing or other tolerances. In any case, the range of variation may include at least values that are within ±1% of the stated value, property, or relationship unless indicated otherwise.

Further modifications and alternative examples will be apparent to those of ordinary skill in the art in view of the disclosure herein. For example, the devices and methods may include additional components or steps that were omitted from the diagrams and description for clarity of operation. Accordingly, this description is to be construed as illustrative only and is for the purpose of teaching those skilled in the art the general manner of carrying out the present teachings. It is to be understood that the various examples shown and described herein are to be taken as exemplary. Elements and materials, and arrangements of those elements and materials, may be substituted for those illustrated and described herein, parts and processes may be reversed, and certain features of the present teachings may be utilized independently, all as would be apparent to one skilled in the art after having the benefit of the description herein. Changes may be made in the elements described herein without departing from the scope of the present teachings and following claims.

It is to be understood that the particular examples set forth herein are non-limiting, and modifications to structure, dimensions, materials, and methodologies may be made without departing from the scope of the present teachings.

Other examples in accordance with the present disclosure will be apparent to those skilled in the art from consideration of the specification and practice of the invention disclosed herein. It is intended that the specification and examples be considered as exemplary only, with the following claims being entitled to their fullest breadth, including equivalents, under the applicable law.

What is claimed is:

1. An information processing device, comprising:

a chassis;

a group of bays coupled to the chassis, each of the bays configured to removably receive a pluggable module;

a liquid cooling system comprising a group of cold plates disposed in the bays, respectively, wherein the cold plates are movable between (i) an engaged state in which the cold plates are positioned to thermally contact pluggable modules received in the bays, respectively, and (ii) a disengaged state in which the cold plates are positioned to disengage from the pluggable modules; and a module locking mechanism configured to:

prevent insertion and removal of the pluggable modules into or out of the bays if the cold plates are in the engaged state by physically blocking the bays; and allow insertion and removal of the pluggable modules into or out of the bays if the cold plates are in the disengaged state, wherein the module locking mechanism comprises a blocking unit configured to, when the cold plates are in the engaged state, physically block the bays by covering a front portion of the bays.

2. The information processing device of claim 1, wherein the module locking mechanism is moveable between a locked state and an unlocked state, in the locked state the locking mechanism prevents insertion and removal of the pluggable modules, and in the unlocked state the locking mechanism allows insertion and removal of the pluggable modules; and wherein the module locking mechanism is configured to:

automatically transition from the unlocked state to the locked state in response to the cold plates being moved to the engaged state; and automatically transition from the locked state to the unlocked state in response to the cold plates being moved to the disengaged state.

3. The information processing device of claim 2, comprising:

a cold plate engagement mechanism configured to move the cold plates between the engaged state and the disengage state; and wherein the module locking mechanism is mechanically coupled to the cold plate engagement mechanism such that motion of the cold plate engagement mechanism drives motion of the module locking mechanism.

4. The information processing device of claim 3, wherein the cold plate engagement mechanism comprises a manually actuatable lever.

5. The information processing device of claim 4, wherein the module locking mechanism comprises a cam coupled to the lever, and a follower coupled to the blocking unit and engaged with the cam such that, actuation of the lever drives motion of the blocking unit via interaction between the cam and the follower.

6. The information processing device of claim 4, comprising:

a cold plate force transfer mechanism engaged with the cold plate engagement mechanism and movable in response to actuation of the cold plate engagement mechanism, wherein the cold plate force transfer mechanism is configured to convert motion of the cold plate force transfer mechanism into motion of the cold plates.

7. The information processing device of claim 1, wherein the module locking mechanism is configured to, while physically blocking the bays, physically block ejection mechanisms of pluggable modules installed in the bays.

8. The information processing device of claim 1, wherein the blocking unit is configured to be moved between a locked state in which the blocking unit blocks the bays to prevent insertion and removal of pluggable modules in the bays, and an unlocked state in which the blocking unit does not block the bays.

9. The information processing device of claim 8, wherein the group of bays comprise a plurality of columns of bays and the blocking unit comprises a plurality of vertical blockers configured to respectively block the plurality of columns in the locked state.

10. The information processing device of claim 8, wherein the group of bays is arranged at a front panel of the chassis, and wherein the blocking unit is movably connected to the front panel such that the blocking unit is movable relative to the bays.

11. The information processing device of claim 1, comprising:

a cold plate engagement mechanism actuatable to move the cold plates between the engaged state and the disengage state; and wherein the module locking mechanism is mechanically coupled to the cold plate engagement mechanism such that actuation of the cold plate engagement mechanism causes the module locking mechanism to change between preventing insertion and removal and allowing insertion and removal.

12. The information processing device of claim 11, wherein the blocking unit is configured to be moved between a locked state in which the blocking unit blocks the bays to prevent insertion and removal of pluggable modules in the bays, and an unlocked state in which the blocking unit does not block the bays, and wherein the blocking unit is mechanically coupled to the cold plate engagement mechanism such that actuation of the cold plate engagement mechanism causes the blocking unit to move between the locked state and the unlocked state.

13. The information processing device of claim 11, wherein cold plate engagement mechanism is configured to be manually actuated.

14. An information processing device, comprising:

a chassis;

a group of bays coupled to the chassis, each of the bays configured to removably receive a pluggable module;

a liquid cooling system comprising a group of cold plates disposed in the bays, respectively, wherein the cold plates are movable between (i) an engaged state in which the cold plates are positioned to thermally contact with pluggable modules received in the bays, respectively, and (ii) a disengaged state in which the cold plates are positioned to disengage from the pluggable modules;

a cold plate engagement lever configured to be manually actuatable to drive the cold plates to move between the engaged state and the disengaged state; and a module locking mechanism mechanically coupled to the cold plate engagement lever such that actuation of the cold plate engagement lever drives the module locking mechanism to change between:

a locked state in which the module locking mechanism prevents insertion and removal of the pluggable modules into or out of the bays by physically blocking the bays; and an unlocked state in which the module locking mechanism allows insertion and removal of the pluggable modules into or out of the bays, wherein the module locking mechanism comprises a blocking unit configured to, in the locked state, physically block the bays by covering a front portion of each of the bays.

15. The information processing device of claim 14, wherein the module locking mechanism is configured to be in the unlocked state if the cold plates are in the disengaged state and to be in the locked state if the cold plates are in the engaged state.

16. The information processing device of claim 14, wherein in response to actuation of the cold plate engagement lever in a first direction, the cold plates are moved by the cold plate engagement lever to the disengaged state and the module locking mechanism is moved by the cold plate engagement lever to the unlocked state, and wherein in response to actuation of the cold plate engagement lever in a second direction, the cold plates are moved by the cold plate engagement lever to the engaged state and the module locking mechanism is moved by the cold plate engagement lever to the locked state.

17. The information processing device of claim 14, wherein the blocking unit is configured to, in the unlocked state, avoid blocking the bays; and wherein the module locking mechanism comprises a cam connected to the cold plate engagement lever and a follower connected to the blocking unit and engaged with the cam such that actuation of the cold plate engagement lever drives motion of the blocking unit.

* * * * *